(12) United States Patent
Kasevich et al.

(10) Patent No.: US 11,456,148 B2
(45) Date of Patent: Sep. 27, 2022

(54) ABERRATION REDUCTION IN MULTIPASS ELECTRON MICROSCOPY

(71) Applicant: The Board of Trustees of the Leland Stanford Junior University, Stanford, CA (US)

(72) Inventors: Mark A. Kasevich, Palo Alto, CA (US); Stewart A. Koppell, Menlo Park, CA (US); Brannon Klopfer, Stanford, CA (US); Thomas Juffmann, Vienna (AT); Marian Mankos, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 110 days.

(21) Appl. No.: 17/053,285

(22) PCT Filed: May 28, 2019

(86) PCT No.: PCT/US2019/034167
§ 371 (c)(1),
(2) Date: Nov. 5, 2020

(87) PCT Pub. No.: WO2019/231908
PCT Pub. Date: Dec. 5, 2019

(65) Prior Publication Data
US 2021/0217578 A1     Jul. 15, 2021

Related U.S. Application Data

(60) Provisional application No. 62/677,119, filed on May 28, 2018.

(51) Int. Cl.
H01J 37/153    (2006.01)
H01J 37/145    (2006.01)
(Continued)

(52) U.S. Cl.
CPC .......... H01J 37/153 (2013.01); H01J 37/145 (2013.01); H01J 37/244 (2013.01); H01J 37/29 (2013.01); *H01J 2237/1534* (2013.01)

(58) Field of Classification Search
CPC ...... H01J 37/153; H01J 37/145; H01J 37/244; H01J 37/29; H01J 2237/1534
See application file for complete search history.

(56) References Cited

U.S. PATENT DOCUMENTS

2017/0261739 A1    9/2017   Juffmann

OTHER PUBLICATIONS

Juffmann et al., "Multi-pass transmission electron microscopy", May 10, 2017, Scientific Reports 7:1699.
(Continued)

*Primary Examiner* — Sean M Luck
(74) *Attorney, Agent, or Firm* — Lumen Patent Firm

(57) ABSTRACT

Improved aberration correction in multipass electron microscopy is provided by having Fourier images of the sample (instead of real images) at the reflection planes of the resonator. The resulting −1 magnification of the sample reimaging can be compensated by appropriate sample placement or by adding compensating elements to the resonator. This enables simultaneous correction of lowest order chromatic and spherical aberration from the electron objective lenses. If real images of the sample are at the reflection planes of the resonator instead, only the lowest order chromatic aberration can be corrected.

7 Claims, 14 Drawing Sheets

(51) Int. Cl.
*H01J 37/244* (2006.01)
*H01J 37/29* (2006.01)

(56) References Cited

OTHER PUBLICATIONS

Juffmann et al., "Multi-pass microscopy", 2016, Nature Communications 7:12858.
Kruit et al., "Designs for a quantum electron microscope", 2016, Ultramicroscopy 164:31-45.
Juffmann et al., "Multi-pass transmission electron microscopy", 2016, arXiv:1612.04931v1.

ABERRATION REDUCTION IN MULTIPASS ELECTRON MICROSCOPY

CROSS-REFERENCE TO RELATED APPLICATIONS

This application is a 371 of PCT application PCT/US2019/034167 filed May 28, 2019. PCT application PCT/US2019/034167 claims the benefit of U.S. Provisional application 62/677,119 filed May 28, 2018.

FIELD OF THE INVENTION

This invention relates to multipass electron microscopy.

BACKGROUND

Improved imaging of samples is of perennial interest in microscopy. One recent approach for improved microscopy is multipass microscopy, first demonstrated in optical microscopy and later extended to electron microscopy. In multipass electron microscopy, an electron resonator is configured to reimage the sample onto itself as electrons make round trips in the resonator. This can provide improved imaging, e.g., in cases where a single-pass image of the sample would have poor contrast. However, aberrations accumulate with each round trip electrons make in the resonator, so conventional electron microscope designs may not suffice for multipass electron microscopy. Accordingly, it would be an advance in the art to provide multipass electron microscopy having improved aberration correction.

SUMMARY

In the earliest reports of multipass electron microscopy, the resonator configuration was such that a real image of the sample is formed at each of the mirror reflection planes (e.g., as on FIG. 5A below). The resulting real image resonator has the advantage that this configuration naturally provides the required reimaging of the sample onto itself with the required +1 magnification.

We have found that there is another possible cavity configuration for multipass electron microscopy, where diffraction planes of the sample (i.e., Fourier images of the sample) are at each of the mirror reflection planes (FIGS. 1 and 5B below). The resulting Fourier image resonator has the complication that this configuration naturally provides the reimaging of the sample onto itself with −1 magnification. However, this magnification issue can be overcome by appropriately positioning the sample or by compensating for the 180 degree image rotation caused by the −1 magnification.

Unexpectedly, we have found that the Fourier image resonator provides improved options for aberration correction compared to the real image resonator. Aberrations from the electron objective lenses typically dominate in designs. The Fourier image resonator allows for simultaneous correction of the lowest order spherical and chromatic aberrations of the electron objective lenses. The real image resonator only allows for correction of the lowest order chromatic aberration. Here the aberration compensation is part of the design of the electron mirrors.

The detailed description below mostly relates to a detailed design example of a multipass electron microscope having a real image resonator. However, similar considerations are expected to apply in the design of multipass electron microscopes having a Fourier image resonator. Furthermore, issues specific to Fourier image resonators are considered below.

DETAILED DESCRIPTION

I) Introduction

Recent advances in cryo-electron microscopy (cryo-EM) and direct electron detection have spurred renewed interest in the development of novel electron imaging techniques for applications in structural biology at atomic resolution. The challenge with imaging unstained biological specimens is that they provide a low scattering cross-section to the probing electrons because they are composed primarily of low atomic number elements. Hence, high electron doses are needed to obtain sufficient signal-to-noise ratios (SNR) in order to overcome the shot-noise limit. Such doses, however, severely damage the specimens. The shot-noise limit can in principle be overcome by using correlated particles, as demonstrated in optical microscopy.

The first proposals for quantum electron microscopy involved interaction-free quantum measurements of entangled electrons. Alternatively, the noise reduction can be achieved by letting a single electron interact with the sample multiple times in what is dubbed multi-pass transmission electron microscopy (MPTEM). In transmission electron microscopy (TEM), where thin biological samples are used, the electrons scatter weakly as they pass through the sample, adopting a small phase change. In MPTEM, the electron beam interacts elastically with the specimen multiple times so that the change in the phase accumulates before reaching the detector. The multiple interaction is accomplished by injecting the electron into a resonator formed by two electron mirrors sandwiching the specimen and the objective lens. Once the electron accumulates a sufficiently strong phase change, it is ejected and the resulting image is magnified onto the detector.

Past simulations have predicted an improvement in resolution and sensitivity for a range of electron microscopy imaging techniques, and an order-of-magnitude reduction in damage at equivalent resolution. Here the electron-optical design of a practical implementation of a MPTEM that is currently under construction is examined.

An important new feature of this work is design of the electron resonator to allow for improved correction of aberrations, since aberration reduction is expected to be critical in practical MPTEM designs.

II) Electron-Optical Layout of a Multi-Pass Transmission Electron Microscope

Figure 1A:
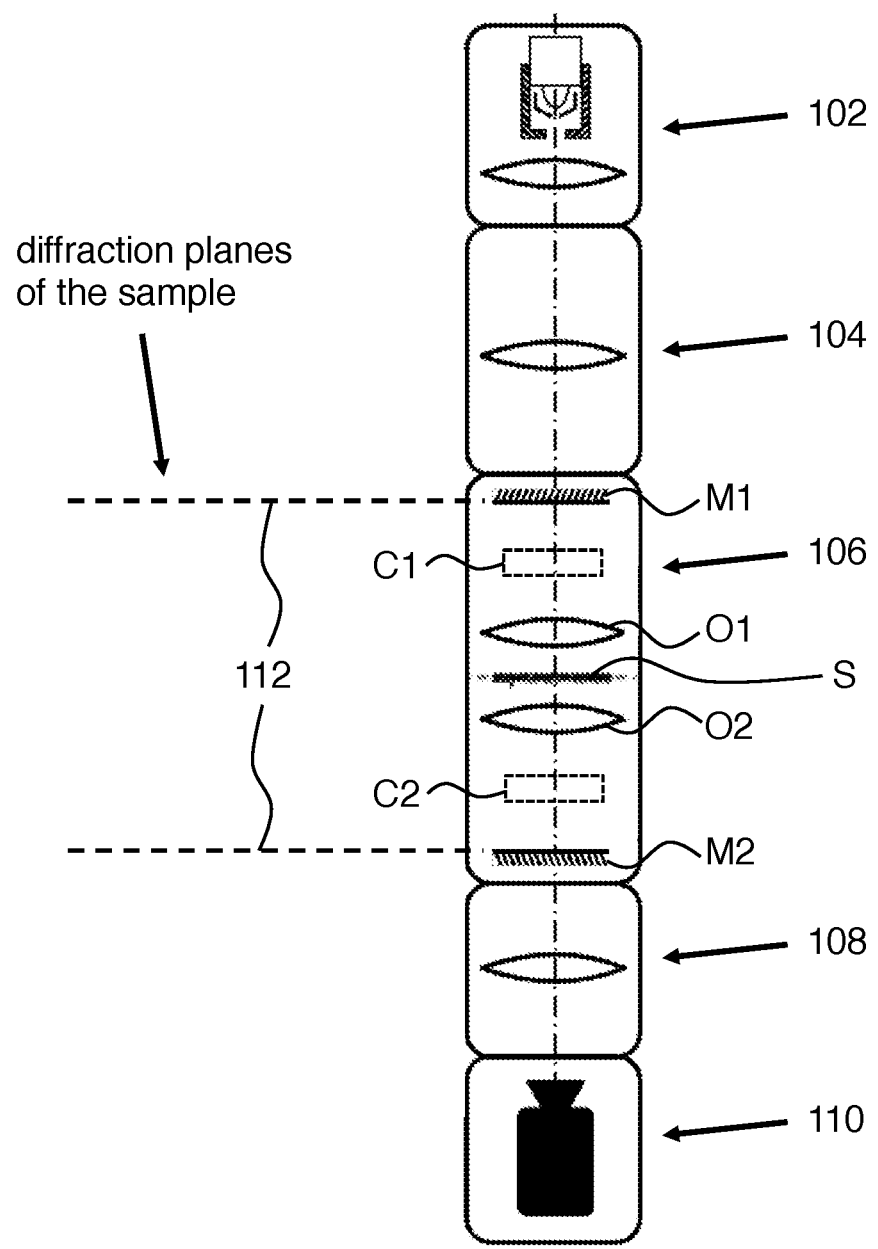
FIG. 1A schematically shows a multipass electron microscope according to an embodiment of the invention.

FIG. 1A shows the key components of the MPTEM, i.e. the pulsed electron gun 102, the illumination optics 104, the resonator optics 106, which includes the objective lenses (O1, O2), mirrors (M1, M2) and specimen (S), and the projection optics 108. The electron pulse, triggered by an ultrafast laser beam, is focused by the illumination optics 104 and transmitted by the entrance electron mirror M1, rendered transparent by a voltage pulse synchronized with the laser beam. The transmitted electron pulse enters an electron resonator, bounded by the entrance and exit mirrors (M1 and M2, respectively). The resonator includes two objective and field lenses that sandwich the specimen. Here O1 and O2 are the objective lenses, and the field lenses are shown on FIG. 5B below.

The electron pulse is collimated by the upper field and objective lens onto the specimen, and refocused by the lower objective and field lens onto the exit mirror, which reflects it back symmetrically so that the electron pulse is collimated again at the specimen. This reflection is carried out multiple times until a second voltage pulse renders the exit mirror M2 transparent to allow the electron pulse with the accumulated phase to proceed into the projection optics 108, which magnifies the image at the exit mirror onto the detector 110. Once the electron is detected, another pulse is triggered, and the whole process is repeated at high frequency until a sufficient electron dose is accumulated by the detector. A magnetic prism may be added to the illumination optics to allow electrons to exit the multi-pass optics through the entrance mirror and be imaged on a separate detector.

The pulsed electron gun 102 determines the electron source parameters, including the pulse frequency, virtual source size, and the angular and energy distributions. The illumination optics 104 provides the required illumination size and convergence angle at the specimen, while the spherical and chromatic aberrations of the objective lenses O1 and O2 limit the ultimate achievable spatial resolution. The projection optics magnifies 108 the specimen image or diffraction pattern at the detection plane.

Initially, both magnetic and electrostatic lenses were considered in the electron-optical design. While magnetic lenses provide superior spatial resolution, they introduce image rotations, which significantly increases the complexity of the resonator optics. The main goal of the prototype electron column is to demonstrate the multi-pass imaging approach. In order to minimize cost, development time and complexity in this phase of the development, an electrostatic column operating at a beam energy of 10 keV has been adopted. In this prototype, a resolution of approximately 5 nm is targeted, which is sufficient to verify the multi-pass concept. A higher resolution microscope can be developed in the future by implementing magnetic lenses and using higher beam energies, as well as by fully utilizing the aberration correction capabilities of the electron mirrors inherent in this approach.

In particular, as shown on FIG. 1A, the electron resonator can be designed to place diffraction planes 112 of the sample such that they coincide with reflection planes of the electron mirrors. As described below, this configuration permits improved aberration compensation.

Figure 1B:
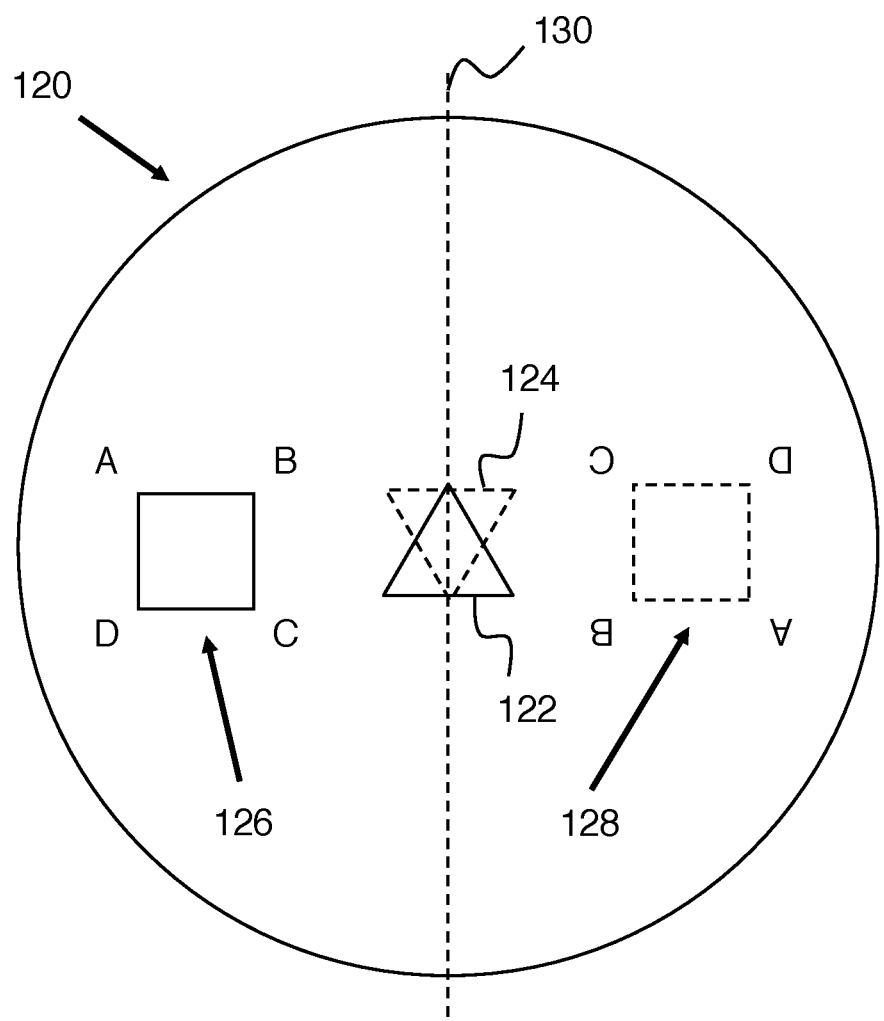
FIG. 1B shows the effect of −1 magnification reimaging on a sample.

However, this electron resonator configuration introduces the complication that the sample isn't reimaged onto itself with +1 magnification. Instead the reimaging is with −1 magnification. The effect of this is shown on FIG. 1B, where the sample plane 120 includes features 122 and 126 that are reimaged as 124 and 128, respectively. The effect of the −1 magnification is seen to be a 180 degree rotation of the sample plane about its center. As can be seen from 124 coinciding improperly with 122, this issue must be dealt with in order for MPTEM to be possible in this resonator configuration. Two approaches are possible.

In one approach, the sample plane 120 is bisected by a line 130 into a first half-area and a second half-area, and the sample is disposed entirely in the first half-area. E.g., feature 126 by itself satisfies this condition. Since rotated image 128 does not coincide with feature 126, it does not spoil the MPTEM principle of operation. As the electrons make multiple round trips in the resonator, electrons will pass through feature 126 multiple times in correct orientation for MPTEM to work. For N cavity round trips by the electrons, the number of passes through the sample is N.

In another approach, compensating elements C1, C2 (e.g., magnetic lenses) are added to the electron resonator to provide a compensating 180 degree image rotation. Here if there are N cavity round trips by the electrons, the number of passes through the sample is 2N.

Specialized software packages developed by MEBS, Ltd. (SOFEM, SORRY, IMAGE and MIRROR DA) were used for the analysis of the MPTEM optics. The SOFEM software package computes the potential distributions of the electrostatic lenses using the Second-Order Finite Element Method. The computed axial lens field functions are subsequently used by the SORRY, IMAGE, and MIRROR DA packages, to compute its optical properties, including aberrations up to fifth-order. The SORRY software package computes and plots electron trajectories by direct ray-tracing through the computed lens fields. The IMAGE software package computes electron-optical properties by propagating bunches of particles through realistic electromagnetic fields, including the fields from the individual particles, by accurate direct ray-tracing to capture the combined effects of Coulomb interactions and aberrations. MIRROR DA is a differential algebra-based (DA) software package that computes the temporal and optical properties, including aberrations of any order, for electron mirrors with any symmetry and can handle combinations of electron mirrors and electron lenses in a unified way. Results computed with MIRROR DA were shown to be in good agreement with those extracted by direct ray tracing with relative deviations of less than 0.065% for all primary aberration coefficients.

II-1) Resonator Optics

The resonator optics distinguishes the MPTEM from a conventional TEM. This optical element includes the objective and field lenses and electron mirrors, needed to establish the resonant, self-imaging beam path. The analysis that follows starts with the objective lens only and subsequently incorporates the field lenses and electron mirrors, which are used to re-image the specimen onto itself.

The electron-optical properties of the objective lens determine the spatial resolution of the MPTEM column. Objective lenses are designed to generate a highly resolved, magnified image of the specimen. The resolution limit due to the spherical and chromatic aberration is only important for the objective lens because the magnification decreases the aperture angle in the following lenses. Even for moderate magnifications of 10-50×, the aperture angle at the subsequent lenses is so small that their spherical and chromatic aberrations can be neglected.

Figure 2A:
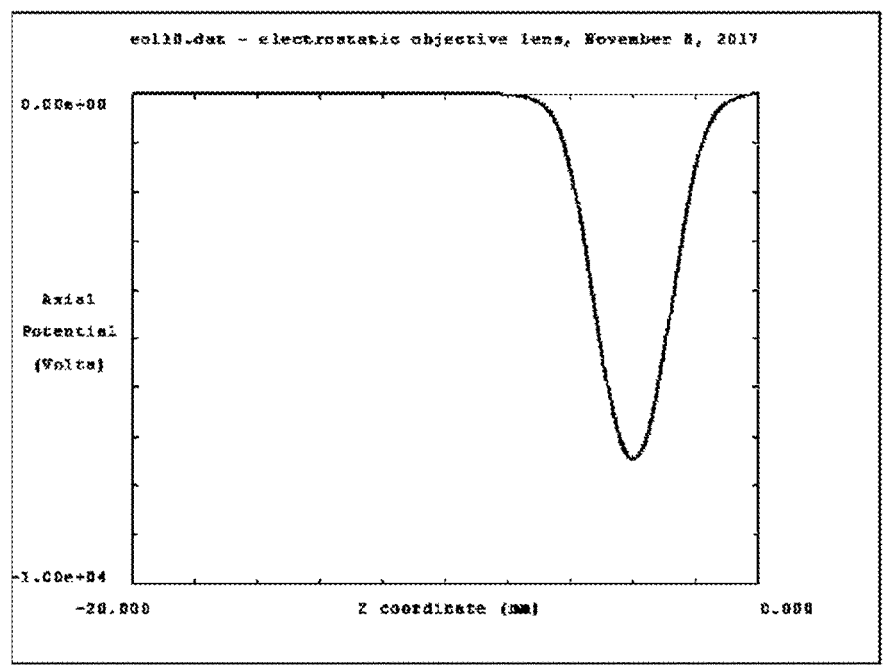
FIGS. 2A-B show electrostatic fields for the objective lens of the design example.
Figure 2B:
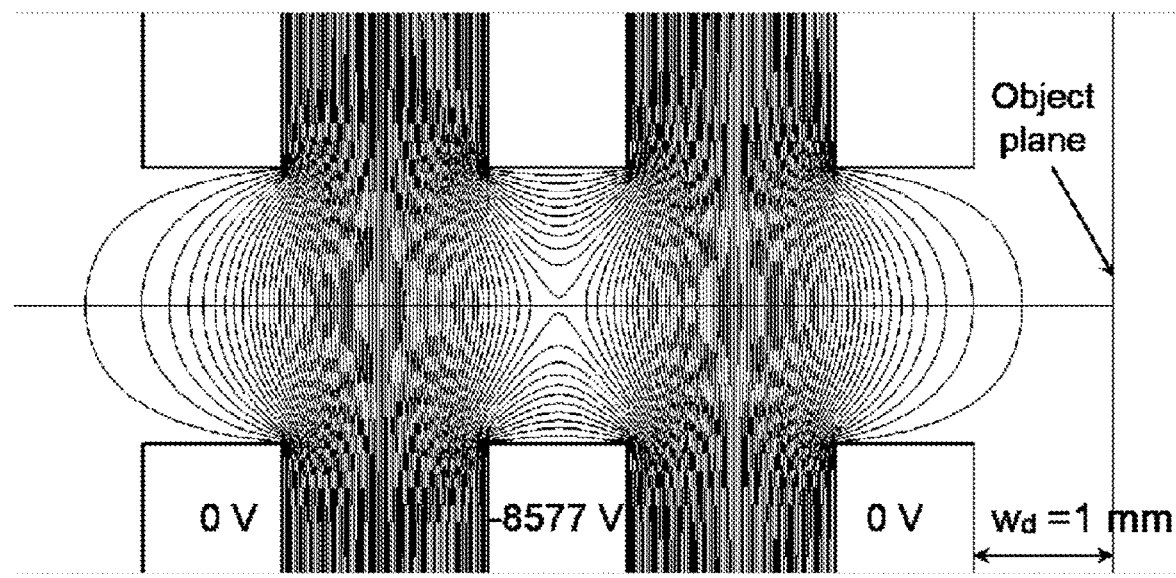

For this prototype, a conventional Einzel lens operating in decelerating mode has been selected. The geometry of the lens electrodes has been optimized for operation at 10 keV in order to achieve short focal lengths and thereby small chromatic and spherical aberration coefficients while maintaining peak electrostatic fields below 10 kV/mm in order to minimize arcing. The geometry of the objective lens and its electrostatic potential distribution is shown in FIGS. 2A-B. Here FIG. 2A shows the axial electrostatic potential distribution of the objective lens (sample is at z=0 on all figures) and FIG. 2B shows the overall electrostatic potential distribution of the objective lens.

Figure 3:
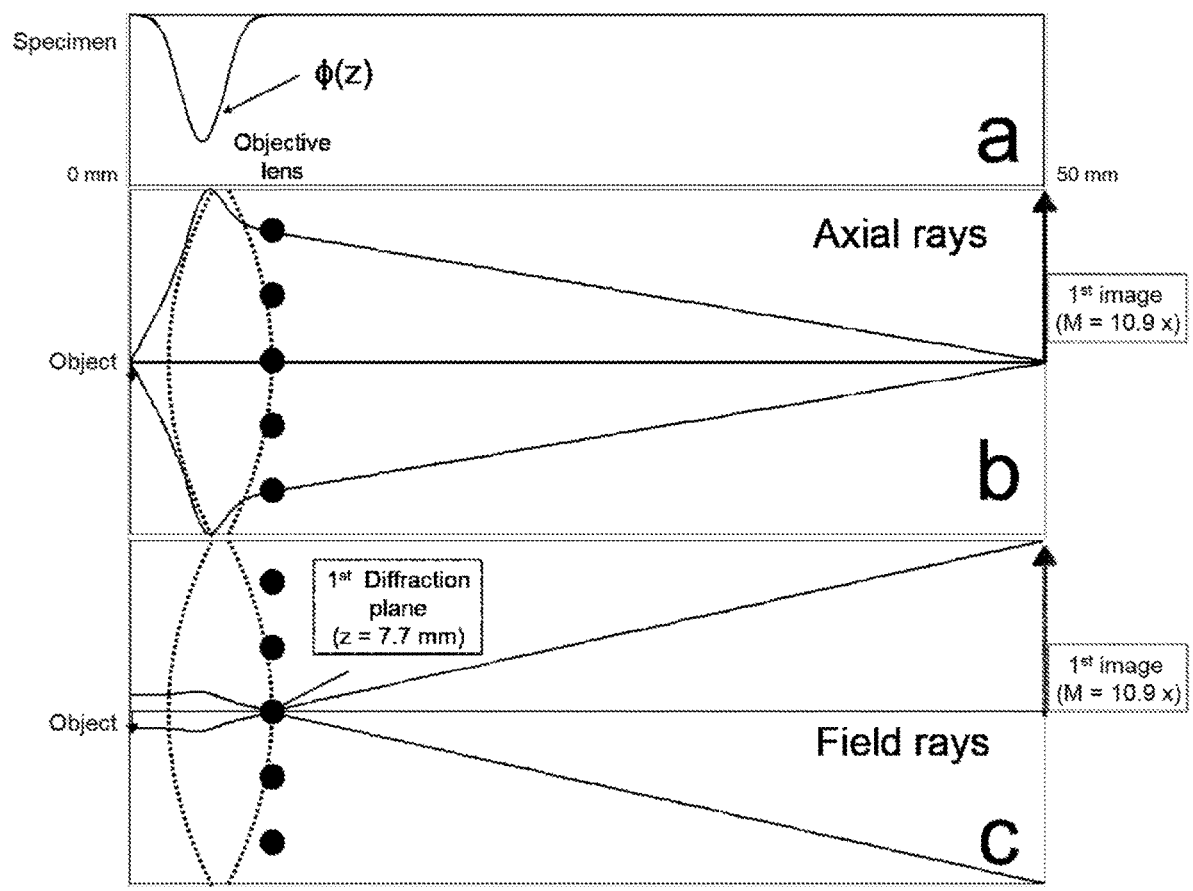
FIG. 3 shows electrostatic fields and ray traces for the objective lens of the design example.

The ray diagram showing the impact of the objective lens is shown in FIG. 3. Here (a) is the axial potential distribution, (b) is an axial ray trace and (c) is a field ray trace. Here, the focusing voltage is approximately −8.6 kV for a working distance $w_d$=1 mm, where the specimen is located 1 mm behind the final electrode face. The specimen is in a field-free region, sandwiched symmetrically from both sides by the electrodes of the two objective lenses. The objective lens magnifies the image, located at z=50 mm, by a factor of approximately 10.9×. Further, the back-focal (diffraction) plane is conveniently located in a field-free region, just outside the last ground electrode of the Einzel lens. With this geometry and stated working distance, the spherical aberration coefficient (referred to the object) is 78.4 mm, while the chromatic aberration coefficient is 17.3 mm. The combined effect of axial (chromatic and spherical) as well as off-axis aberrations (coma, astigmatism, field curvature and distortion) has been evaluated for fields of view of 1 and 10 µm (at the specimen), and for a range of object angles.

Figure 4A:
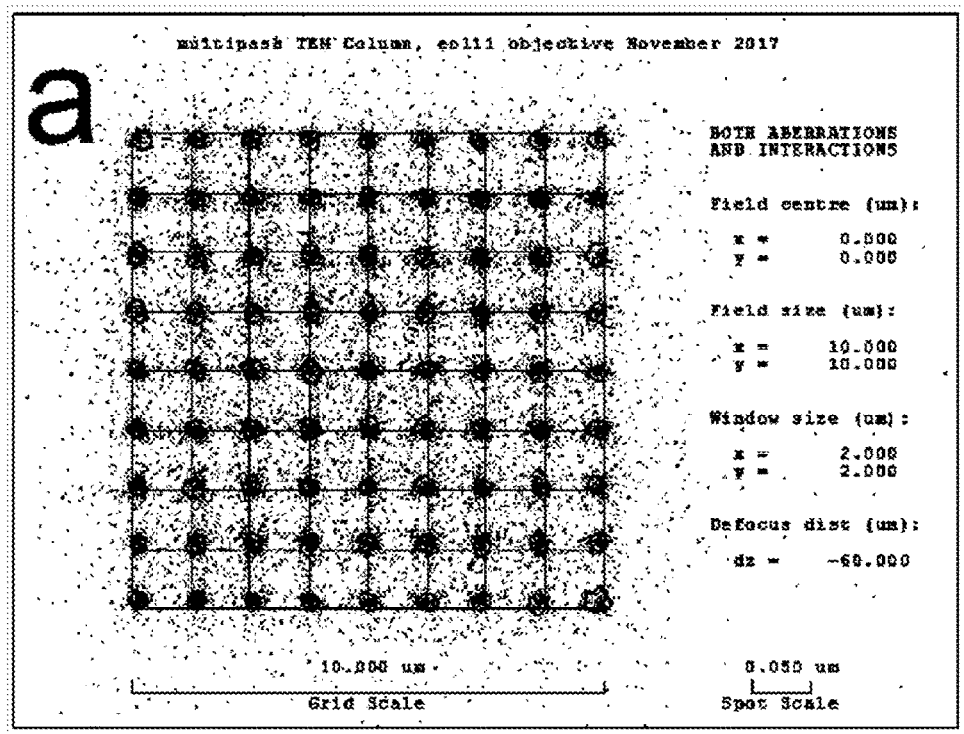
FIGS. 4A-B show optical blur from the objective lens of the design example.
Figure 4B:
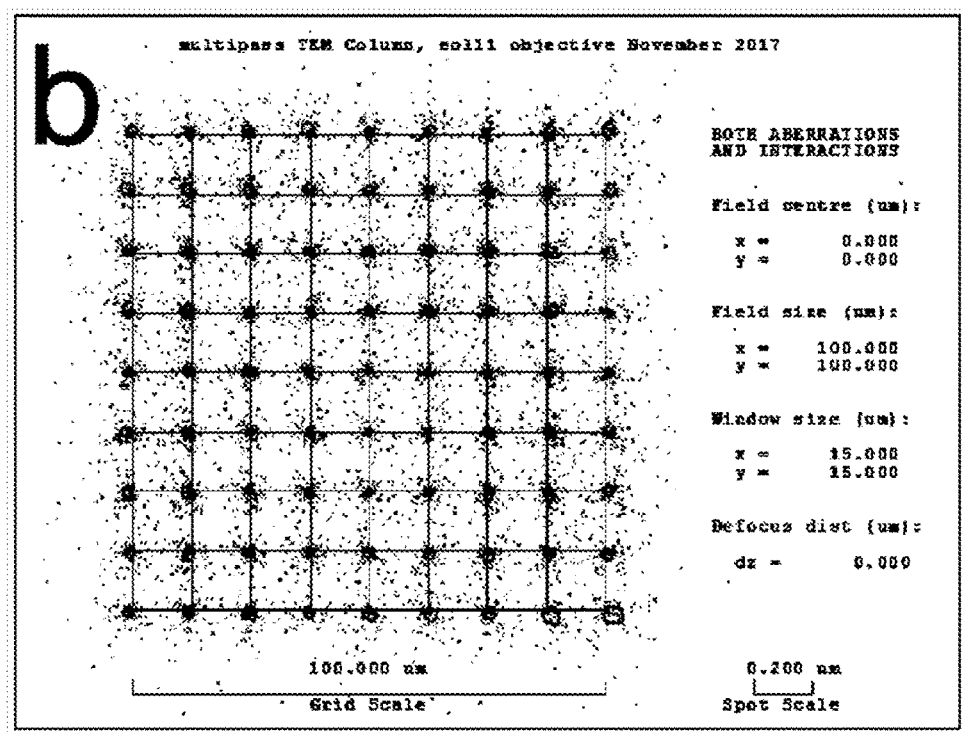

FIGS. 4A-B shows the blur in the first image plane, after the initial magnification by the objective lens, with an object angle of 3 mrad (at the specimen plane), for 1 and 10 µm fields of view respectively. As illustrated in FIG. 4A, the blur is dominated by axial aberrations for a 1 µm field of view (at the specimen) with an object angle of 3 mrad. Here, the field aberrations of the objective lens do not appreciably deteriorate the spatial resolution across the field of view. The contour plots show an average 20-80% blur of less than 20 nm and a distortion of less than 10 nm at the corner of the field of view, which corresponds to a blur of ~2 nm at the specimen plane. For an object angle of 3 mrad, the diffraction blur is ~2.2 nm and comparable to the blur of the geometric and chromatic aberrations, yielding an optimum total blur of approximately 3 nm. Even for the larger field of view of 10 µm (at the specimen) show in FIG. 4B, the field aberrations of the objective lens are still negligible. The contour plots show an average 20-80% blur of less than 30 nm and a distortion of less than 10 nm at the corner of the field of view, which corresponds to a blur of ~3 nm at the specimen plane, yielding an optimum total blur of less than 4 nm.

Figures 5A, 5B:
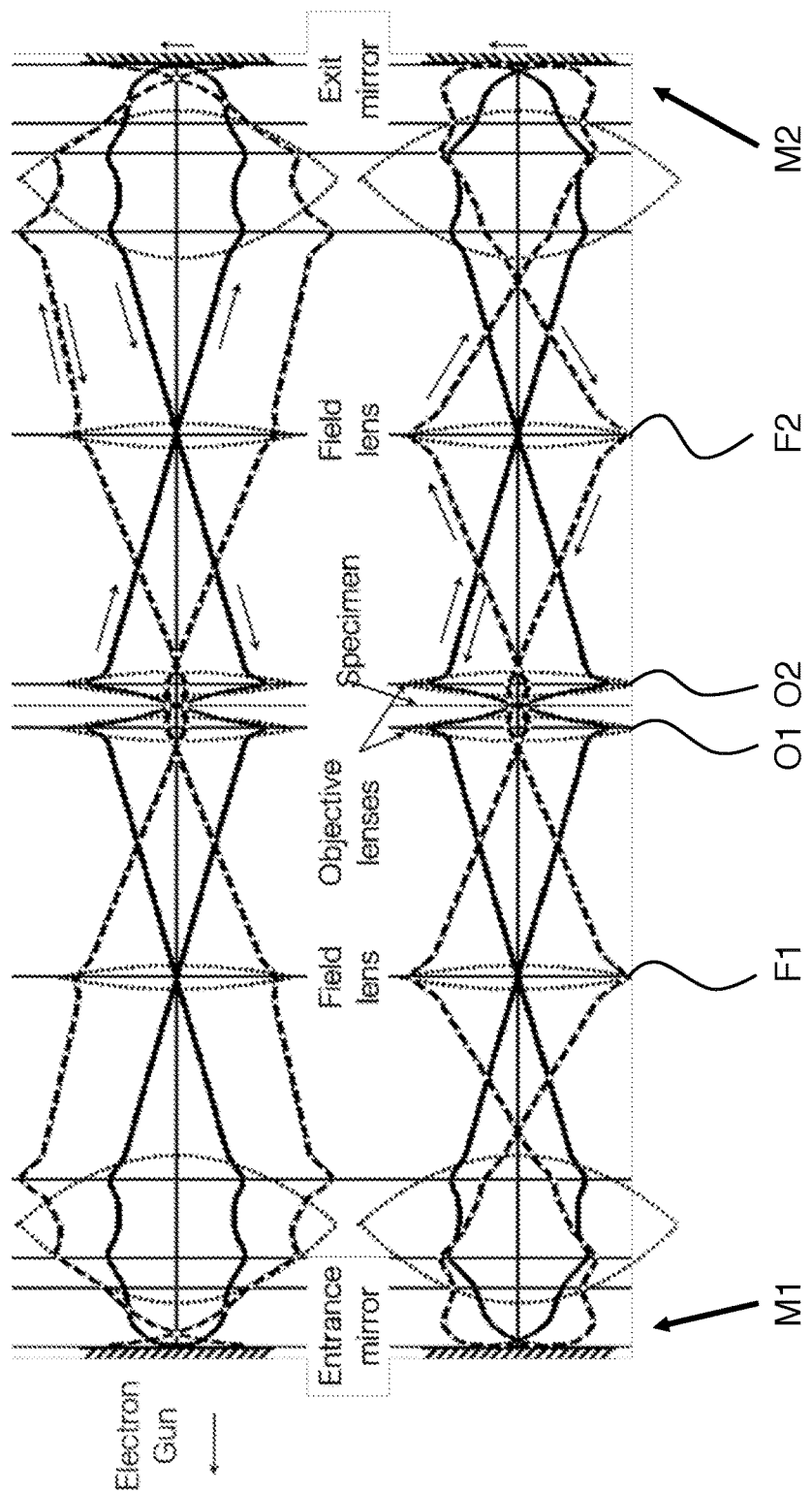
FIG. 5A shows a ray trace of a prior art resonator configuration.
FIG. 5B shows a ray trace of a resonator configuration according to an embodiment of the invention.

Two detailed layouts of the resonator optics tuned for multi-passing is shown in FIGS. 5A and 5B. To better appreciate the present invention, the design of the prior art configuration of FIG. 5A is considered in comparison with the embodiment of FIG. 5B. Here, the electron mirrors are biased for reflection. As shown, the optical layout is symmetric about the specimen plane with each side containing an objective lens, a field lens, and a mirror. In order to accumulate the change in the phase imparted to the electrons by the sample, the electrons must impact the sample at the same location with each pass though the sample. To this end, the optics of the resonator must image the specimen onto itself with a +1× magnification. The 1× magnification implies that the back-focal plane of the objective lens must also be imaged onto itself.

The simplest case of +1× magnification is illustrated in the diagram of FIG. 5A, where the path of the fundamental rays are shown over one full period. Here, the axial rays (solid lines) are defined to emanate from the sample plane on-axis with a unit slope, while the field rays (dashed lines) are defined to start off-axis at a unit distance with zero slope. The axial ray is tuned by the objective lens to pass through the center of the field lens to make the ray practically insensitive to the action of this lens. The mirror is tuned to place the axial ray on axis at the reflection plane. This condition guarantees that the axial ray traces a path back onto the sample that is symmetric about the optical axis, thereby imaging the sample onto itself. The field lens is then tuned to make the field ray retrace its path upon reflection.

Another possible imaging condition of the resonator is illustrated in the diagram of FIG. 5B. As in the previous case, the objective lens is tuned to place the axial ray at the center of a field lens. Here, the mirror is tuned to make the axial ray retrace its path upon reflection, and the field lens is tuned to place the field ray on axis at the reflection plane, thereby reversing the role of the two fundamental rays. These conditions, however, yield a net −1× magnification. To recover a +1× magnification, either magnetic lenses can be used to rotate the image by 180° (e.g., C1, C2 on FIG. 1A), or the specimen can be restricted to reside in a half-plane (e.g., 126 on FIG. 1B), as is often done in electron holography. The advantage of this imaging condition is the relative ease with which the electron mirrors can be tuned to correct both the spherical and chromatic aberrations of the objective lens to significantly decrease the round-trip aberrations. In the first mode, only the chromatic aberration of the objective lens has been successfully corrected so far.

Electron mirrors are typically used as aberration correctors, in particular in low energy electron microscopes (LEEMs). Mirrors with four electrodes can correct primary spherical and chromatic aberration. With five electrodes, they can also correct fifth order spherical aberration. In the particular case of a hyperbolic mirror, the aberration coefficients can be calculated analytically, but in general they are found computationally by scanning large areas of parameter space. While the primary purpose of the gated mirrors is to reimage the sample, they can also be used to correct the chromatic and spherical aberrations of the objective lens each pass. Round-trip aberrations were minimized using Munro's Electron Beam Software (MEBS). In one design example for the reference configuration of FIG. 5A, chromatic aberration can be fully corrected, leaving the spherical aberration of the objective lenses ($C_s$~80 mm) as the dominant source of image blur. It is expected that a design as in FIG. 5B can significantly reduce this spherical aberration while simultaneously providing full correction of the lowest order chromatic aberration, as above. Fifth order geometric aberrations and fourth and fifth rank chromatic aberrations are negligible.

Figure 6:
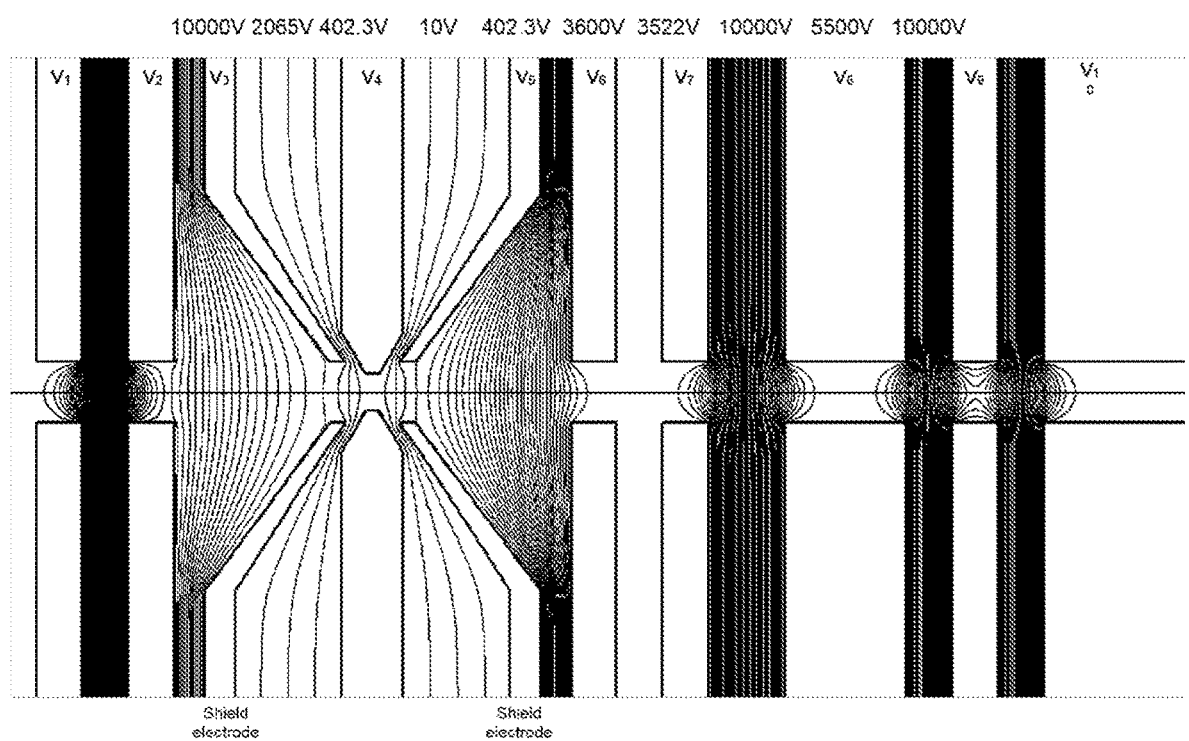
FIG. 6 shows the electrostatic potential distribution for the electron mirror of the design example.

The geometry of the entrance electron mirror, which is composed of rotationally symmetric electrodes, is shown in FIG. 6, together with the equipotential distribution for correcting the chromatic aberration of the objective lens. The entrance and exit electrodes are grounded ($V_1=V_{10}=0$ keV) while the thick, V-shaped gated electrode ($V_4=-10.09$ keV) is biased at a potential that is slightly more negative than the electron emitter to reflect the electron beam. The two slanted electrodes surrounding the gated electrode are biased a few hundred volts more positive ($V_3=V_5=-9.6$ keV) than the gated electrode. These electrodes effectively shield the gated electrode to minimize the extent of the transient fields when the mirror is pulsed to transmit the electron beam.

The next two electrodes provide the two potentials ($V_6=-6.4$ keV, $V_7=-6.5$ keV) needed to tune the spherical and chromatic aberration coefficients of the objective lens and to focus the mirror in conjunction with the potential of the gated and shielding electrodes ($V_4$ and $V_5$). The next electrode is grounded ($V_8=0$ keV), and the remaining electrode ($V_9=-6.4$ keV) forms an auxiliary lens that provides an additional focusing degree of freedom for the mirror.

Figure 7:
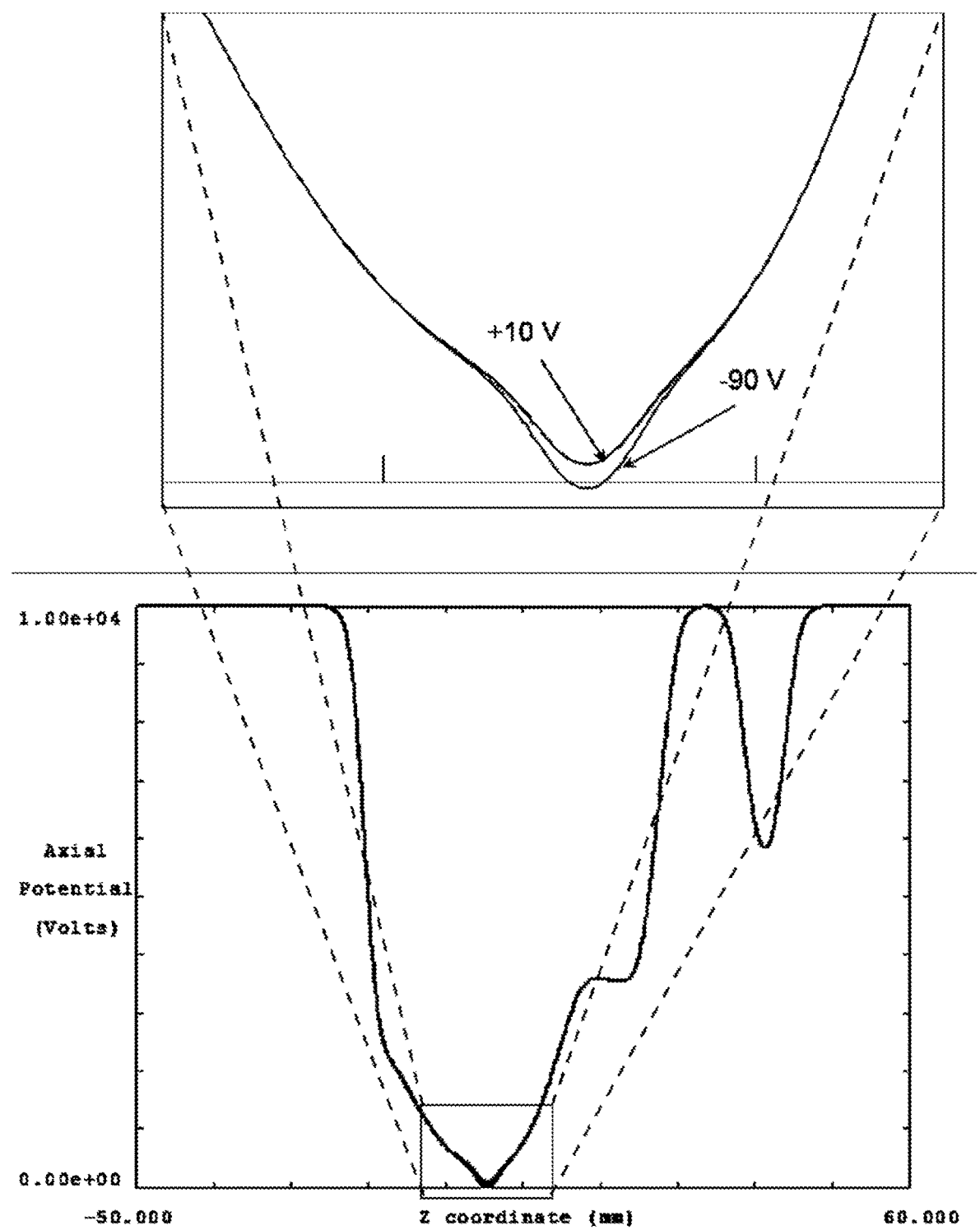
FIG. 7 shows the on-axis electrostatic potential distribution for the electron mirror of the design example, as used to gate the mirror.

The axial distribution of the electrostatic potential in the entrance mirror for the two distinct states (open and closed) is shown in FIG. 7. Here the zoomed-in region marked by the box covers the vicinity of the gated and shield electrodes. To change states, the gate electrode is pulsed with the remaining electrodes held constant. When the gate electrode is set to $V_4=-10.09$ keV, the electrons cannot penetrate through the mirror potential (lower curve in top panel of FIG. 7). When an additional +100 V bias is applied to the gate electrode ($V_4=-9.01$ keV), electrons have sufficient kinetic energy to penetrate the mirror and enter or exit the resonator (upper curve in top panel of FIG. 7).

At a 10 keV beam energy, the period of one full cycle lasts approximately 10-15 ns, which for an optimum number of 10 passes implies one electron can be detected in about 100 ns. Hence, with a 10 MHz repetition rate, a total of $10^7$ electrons can be detected in 1 s.

II-2) Illumination Optics

In MPTEM, the illumination optics should transmit the electron beam from the electron emitter through the entrance electron mirror, rendered transparent by a voltage pulse synchronized with the laser beam, and flood-illuminate the desired imaging area with a nearly uniform, parallel electron beam. This task is accomplished by focusing the virtual electron source into the back focal plane of the first objective lens. The illumination path includes the first half of the resonator optics, i.e. the strongly focusing mirror lens, as well as the field lens. Further, the area illuminated at the specimen is required to vary from about 1 to 50 µm, without the use of an aperture so that no beam current is lost. To cover this range, the illumination optics should vary the magnification of the virtual source by 50-100× in order to vary the convergence angle at the back focal plane, which in turn varies the illuminated area at the sample.

The illumination optics should perform the above functions without altering any of the settings in the resonator optics (with the exception of the mirror electrode bias of +100 V required to pass the electrons through). In the MPTEM optics, the change in the illumination area is accomplished by utilizing the (magnetic) gun lens and one additional electrostatic condenser lens, located between the gun lens and the mirror.

Figure 8:
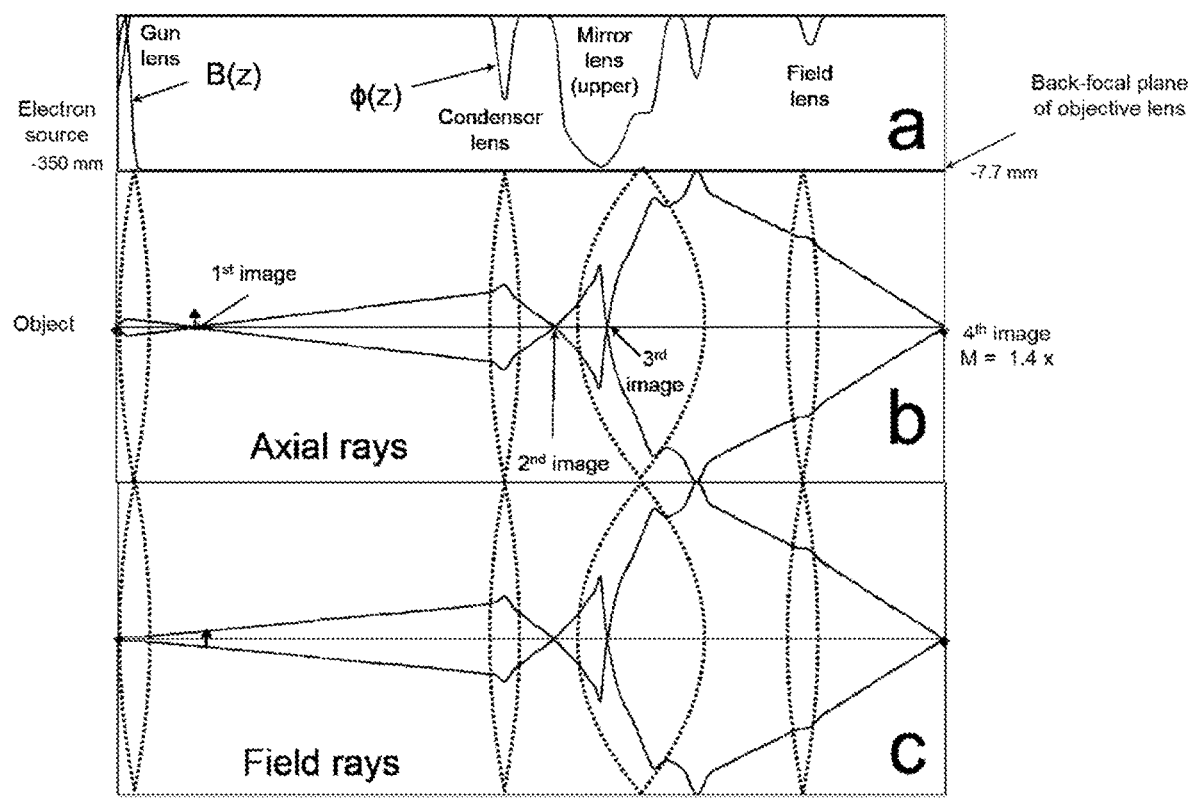
FIG. 8 shows electrostatic fields and ray traces for the illumination optics of the design example.

A detailed layout of the illumination optics including the entrance part of the resonator optics is shown in FIG. 8, with the gated entrance mirror electrode now biased for in-coupling of the electron beam. Here (a) is the axial potential distribution, (b) is an axial ray trace and (c) is a field ray trace. The electron emitter is a Schottky electron gun manufactured by Delong Instruments. The gun was modified to allow for pulsed operation via laser illumination of the Schottky electron emitter. The electron gun includes a magnetic immersion lens that is used to focus the exiting beam. Note that since the magnetic lens is not part of the resonator optics, it does not introduce any image rotation inside the resonator. The gun lens forms a first image of the virtual source in front of the condenser lens, which in turn forms the second image near the entrance of the electron mirror. The strong negative bias of the gated electrode, just below reflection, produces a strong focusing action to yield a third image inside the mirror, in the vicinity of the gated electrode. The combined focusing action of the preset mirror and field lens then results in a fourth image at the back focal plane of the objective lens. The strength of the gun and condenser lens can be varied to adjust the magnification between the electron source and the back-focal plane of the objective lens to vary the area illuminated at the sample over a large range from approximately 0.5 to 50 µm.

Figure 9A:
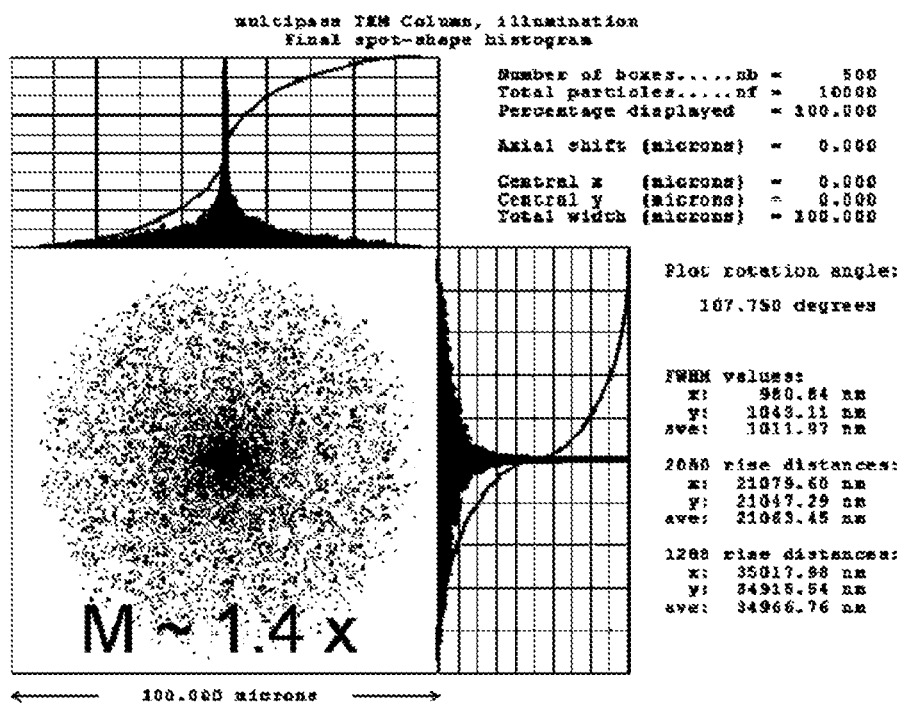
FIGS. 9A-C show spot shapes from the illumination optics of the design example.

The ray diagram shown in FIG. 8 illustrates a case with low net magnification of 1.4×, resulting in a large convergence angle and thus a relatively large illuminated specimen area of 26 µm. The resulting spot shape generated by the illumination optics in the back-focal plane of the MPTEM objective lens is shown in FIG. 9A. Here the spot size is limited by spherical aberration accumulated in the mirror lens, resulting in a 12-88 blur of approximately 35 µm, while the FWHM is approximately 1 µm.

Figure 9B:
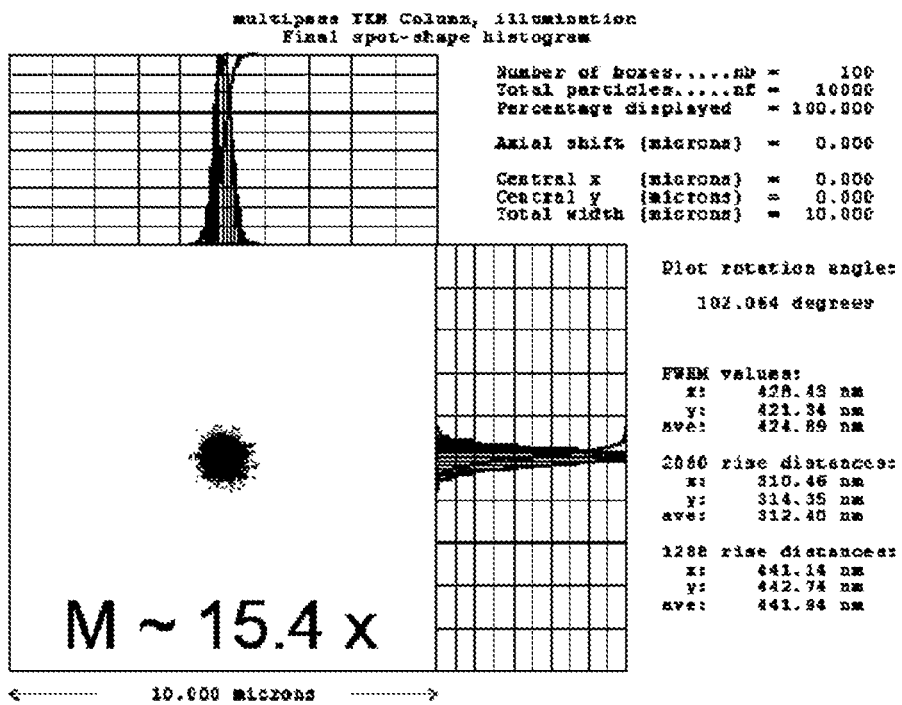
Figure 9C:
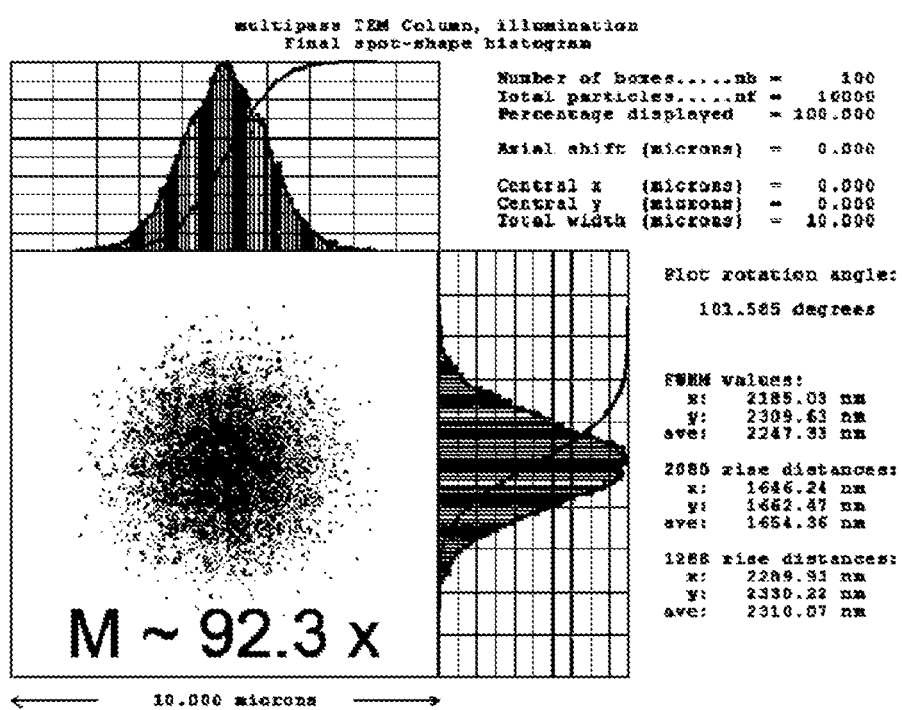

The resulting spot shape generated by the illumination optics with a large net magnification of 92.3× with a field of view of approximately 0.5 µm at the specimen is shown in FIG. 9C. In this case, the spot size profile is nearly Gaussian and now limited by the magnification of the virtual source, resulting in a 12-88 blur of approximately 2.3 µm, and a FWHM of approximately 2.2 µm.

The optimum field of view, determined by the expected optimum resolution and our 2 kpixel×2 kpixel detector, is approximately 2.5 µm. This field of view is obtained with a magnification of 15.4×. In this case, the spot size is near its minimum and limited by the magnification of the virtual source, resulting in a 12-88 blur of approximately 0.44 µm, and a FWHM of approximately 0.42 µm. This ensures that the specimen illumination is collimated to better than 0.1 mrad. FIG. 9B shows the resulting spot shape.

II-3) Projection Optics

In MPTEM, the electron beam must be transmitted from the resonator optics into the projection optics, through the exit electron mirror, rendered transparent by a voltage pulse synchronized with the laser beam. The MPTEM projection optics follows the resonator optics and includes an intermediate lens and two projector lenses. The intermediate lens magnifies either the specimen image or its diffraction pattern at the entrance plane of the projection optics, and the projection lenses are then used to achieve the desired magnification on the viewing screen. The design of intermediate and projector lenses is distinctly different from those corresponding to high quality objective or condenser lenses. In the projector, the aperture-dependent (axial) aberrations are negligible because the intermediate images at the object plane of the projector lenses are already at considerable magnification, rendering the corresponding aperture angles small in comparison to the aperture angle present in the objective lens. Hence, there is no benefit in optimizing these lenses to reduce the spherical and chromatic aberration coefficients. On the other hand, projector lenses should admit relatively large image fields. Hence, the aberrations that dominate in these lenses are the so-called field aberrations, including distortion, coma, field curvature, and the chromatic aberration of magnification and rotation.

Figure 10:
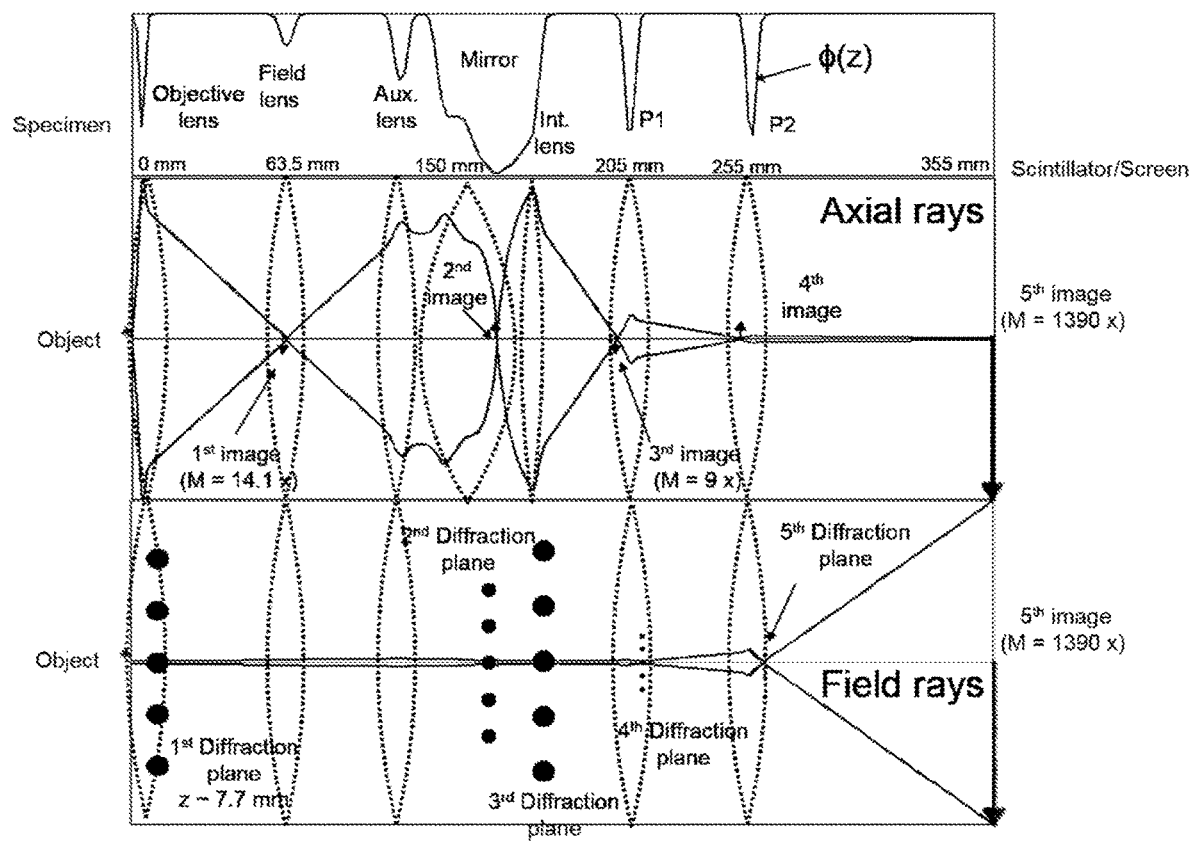
FIG. 10 shows electrostatic fields and ray traces for the projection optics of the design example.
Figure 11A:
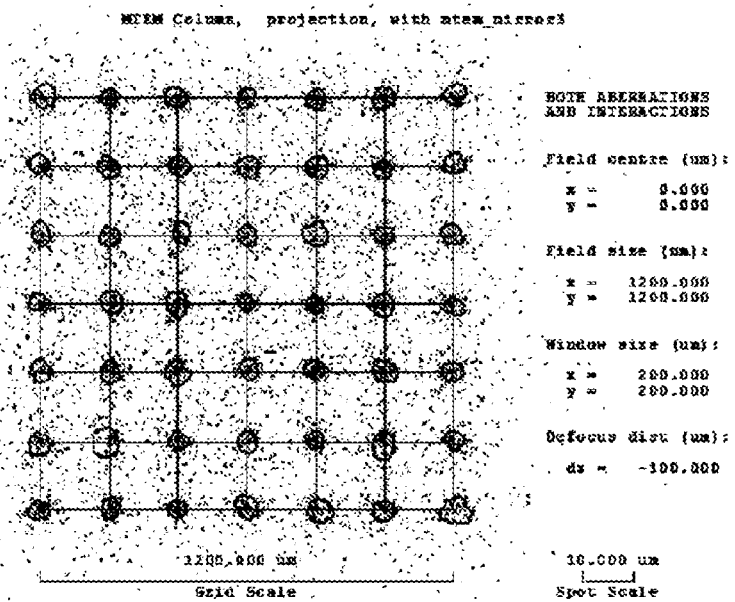
FIGS. 11A-C show optical blur introduced by the projection optics of the design example.
Figure 11B:
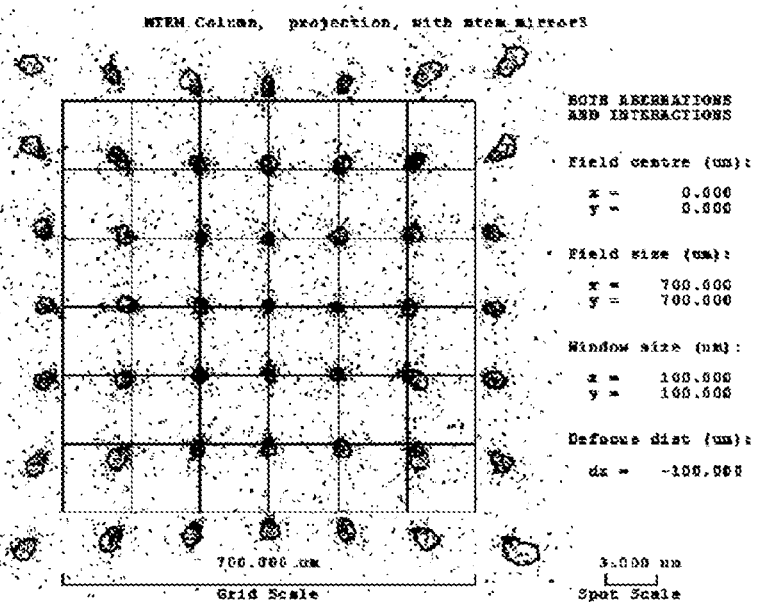
Figure 11C:
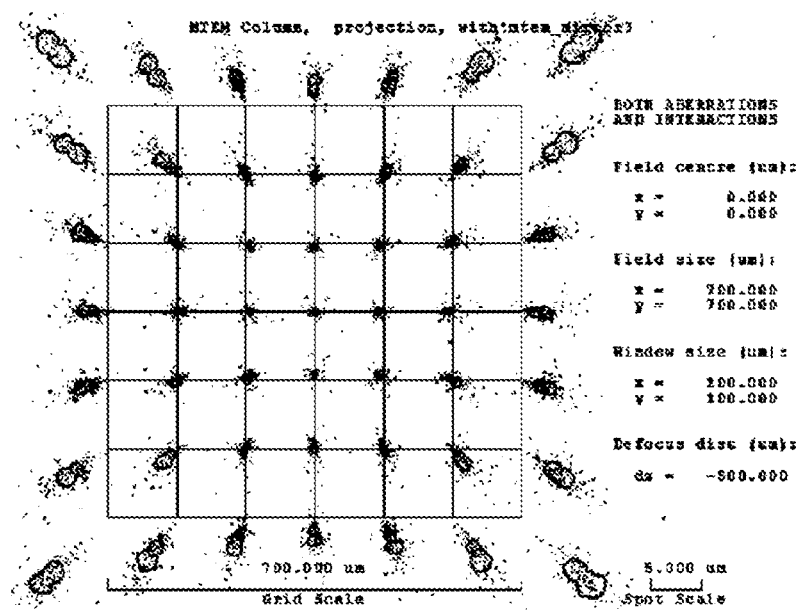

A detailed layout of the projection optics including the exit part of the resonator optics is shown in FIG. 10, with the gated exit mirror electrode now biased for out-coupling of the electron beam. Here (a) is the axial potential distribution, (b) is an axial ray trace and (c) is a field ray trace. Starting the analysis from the specimen plane, the objective lens forms a first image of the specimen at the center of the field lens, and the mirror forms a second image near its gated electrode. The electrode following the shield electrode forms the intermediate lens, which focuses a third image in front of the first projector lens (P1). The combined focusing action of the objective, mirror and intermediate lens then results in a net magnification of approximately 9×. The strength of the projector lenses P1 and P2 can be varied to adjust the magnification between the specimen plane and the detector plane from approximately 50 to 5,000×. The ray diagram shown in FIG. 10 illustrates a case with a net electron-optical magnification of 1,390×. The electron image formed on the scintillator in the detection plane can then be further magnified by an optical zoom lens by up to 20× onto a CCD camera. The resulting spot diagrams generated by the projection optics at the detector plane of the MPTEM are shown in FIGS. 11A-C for three magnification settings with an object angle of 3 mrad. The results show that a magnified image of the specimen can be transported through the mirror into the projection optics with high resolution for practical fields of view ranging from 1 to 10 µm.

For the very high magnification case (FIG. 11A, 1390×) corresponding to a small field of view of 1 µm at the specimen, the blur is dominated by the axial aberrations of the objective lens: the field aberrations of the complete projection optics including the transfer through the exit mirror are negligible. The contour plots show an average 20-80% blur of less than 3.5 µm and a distortion of less than 1 µm at the corner of the field of view, at the detector plane, which corresponds to a blur of approximately 2.5 nm and a distortion of less than 1 nm at the specimen plane.

For the high magnification case (FIG. 11B, 246.5×) corresponding to a medium field of view of 3 µm at the specimen, the blur is beginning to be affected by the field aberrations of the projection optics. Still, the deterioration in the spatial resolution across the field of view remains small. Near the axis, the contour plots show an average 20-80% blur of less than 0.7 µm, which corresponds to a blur of less than 3 nm at the specimen plane. At the corner of the field of view, field aberrations increase the average 20-80% blur to approximately 1.5 µm and introduce a distortion of approximately 4 µm, which corresponds to a blur of approximately 6 nm and a maximum distortion of 16 nm at the specimen plane.

For the low magnification case (FIG. 11C, 79.8×) corresponding to a large field of view of 10 µm at the specimen, the blur is appreciably affected by the field aberrations of the projection optics. However, the deterioration in the spatial resolution across the field of view is still tolerable, as this image setting is meant for orientation of the specimen and for locating areas of interest. Near the axis, the contour plots show an average 20-80% blur of less than 0.5 µm, which corresponds to a blur of less than 6 nm at the specimen plane. At the corner of the field of view, field aberrations increase the average 20-80% blur to approximately 4 µm and introduce a distortion of approximately 10 µm, which corresponds to a tolerable blur of approximately 50 nm and distortion of 125 nm at the specimen plane.

III) Summary

The electron-optical concept of a novel multi-pass transmission electron microscope has been presented. In this imaging technique, the electron beam interacts elastically with the specimen multiple times so that the change in the phase accumulates before reaching the detector. The novel electron-optical column utilizes an electron-optical resonator formed by two electron mirrors sandwiching the sample and objective lenses. Detailed electron-optical analysis of the MPTEM and its key components were performed using state-of-the-art simulation software, yielding an optical design that is suitable for a prototype operating at a 10 keV beam energy. A gated electrostatic mirror and complementary illumination and projection optics has been proposed to achieve efficient in- and out-coupling of the electron beam. Simulations of the electron-optical properties of the MPTEM show that this microscope can achieve a spatial resolution of approximately 5 nm for a practical range of illumination and image magnification.

The invention claimed is:

1. A multipass electron microscope comprising:
   an electron source;
   an electron resonator including two electron mirrors and configured to include a sample at a predetermined sample location, wherein the electron resonator is configured to provide multipass electron reimaging of the sample location such that diffraction planes of the sample location coincide with reflection planes of the electron mirrors;
   electron illumination optics configured to receive an electron beam from the electron source and to provide electron illumination to the electron resonator;
   electron projection optics configured to receive a multipass electron output from the electron resonator;
   an electron detector configured to receive the multipass electron output from the electron resonator and configured to provide an output image.

2. The electron microscope of claim 1, wherein an available sample area at the sample location is bisected by a midline into a first half-area and a second half-area, and wherein a 180 degree image rotation provided by each electron mirror is compensated for by disposing the sample entirely within the first half-area.

3. The electron microscope of claim 1, wherein a 180 degree image rotation provided by each electron mirror is compensated for by disposing at least one compensating element between each electron mirror and the sample location.

4. The electron microscope of claim 3, wherein the compensating element comprises a magnetic electron lens.

5. The electron microscope of claim 1, wherein the electron mirrors are configured to simultaneously compensate for both spherical aberration and chromatic aberration introduced by other elements in the electron resonator.

6. The electron microscope of claim 1, wherein the electron resonator includes elements M1, F1, O1, O2, F2, M2 disposed in sequence along an axis, wherein M1 and M2 are the electron mirrors, wherein F1 and F2 are electron field lenses, wherein O1 and O2 are electron objective lenses, and wherein the sample location is midway between O1 and O2.

7. The electron microscope of claim 6,
wherein an axial ray emanates from the sample location from an on-axis point with non-zero slope,
wherein a field ray emanates from the sample location from an off-axis point with zero slope,
wherein O1 and O2 are tuned to place the axial ray at the center of F1 and F2, respectively,
wherein F1 and F2 are tuned to place the field ray on axis at M1 and M2, respectively, and
wherein M1 and M2 are tuned to make the axial ray retrace its path on reflection.

* * * * *